July 6, 1971 A. F. McKELVEY 3,591,465

SELECTIVE SILICON GROOVE ETCHING USING A TANTALUM OXIDE MASK FORMED AT ROOM TEMPERATURES

Filed Sept. 15, 1969

INVENTOR
ANDREW F. MCKELVEY
BY Gaywood N. Mann
[illegible signature]
ATTORNEYS

United States Patent Office
3,591,465
Patented July 6, 1971

3,591,465

SELECTIVE SILICON GROOVE ETCHING USING A TANTALUM OXIDE MASK FORMED AT ROOM TEMPERATURES

Andrew F. McKelvey, Lansdale, Pa., assignor to the United States of America as represented by the Secretary of the Navy Filed Sept. 15, 1969, Ser. No. 857,991
Int. Cl. C23b *5/48*
U.S. Cl. 204—15 6 Claims

ABSTRACT OF THE DISCLOSURE

In silicon groove etching, the improved method of applying a tantalum coating to a silicon base material, masking the tantalum coating with photoresist materials, chemically removing the exposed portion of tantalum, stripping the photoresist and anodizing the remaining tantalum to form an oxide, thus providing an inert tantalum oxide mask in the subsequent etching of the silicon base material.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Field of the invention

The present invention realtes to a novel etching procedure and more particularly to selective silicon etching using a tantalum oxide masking layer.

Description of the prior art

Heretofore difficulty has been experienced in most techniques for etching silicon based materials during the masking step. Organic photoresists, evaporated oxides and vapor plated oxide layers which are normally created at temperatures in excess of 350° C. have been used individually or as composite films in forming the masking layer. The acid resistant properties of these films are inadequate to effectively mask the underlying silicon for the time required to etch isolation grooves for example in the exposed silicon. An additional drawback in the use of many mask formation processes is the film formation temperature which usually exceeds 350° C. It is well known that temperatures of about 385° C. even for short periods of time will degrade shallow diffused transistors which are normally manufactured by etching techniques. Accordingly such high temperatures used in the prior art mask formation processes may cause severe damage and eventual failure of the transistor. Furthermore any material used for bonding purposes such as the glass or epoxy utilized in transistor fabrication may be adversely affected by high temperatures. Thus, a need exists for an etching procedure involving silicon base materials in which the masking films are acid resistant to permit removal of silicon without any acid attack on the masked silicon regions. A further need is for a masking film formed at low temperatures.

SUMMARY OF THE INVENTION

The present invention comprises an improved mask formation technique in a method relating to silicon etching. The improvement involves applying a tantalum layer to a silicon based object, masking the tantalum coated object with light-sensitive materials, chemically removing the exposed portion of tantalum, stripping the remaining light sensitive material, and anodizing the tantalum to the oxide, thus providing an inert tantalum oxide mask of desired configuration in etching the base silicon.

This novel procedure supplies the existing need for an acid resistant masking film which is formed at moderate temperatures.

OBJECTS OF THE INVENTION

It is an object of the present invention to provide a reliable method of etching a basic silicon substructure masked by a tantalum oxide cover.

It is another object of the present invention to provide a reliable method of etching a basic silicon substructure in which the tantalum oxide is formed at room temperature.

It is still another object of this invention to provide an improved method of manufacturing air isolated microcircuits.

Other objects, advantages, and novel features of the invention will become apparent from the following detailed description of the invention when considered in conjunction with the accompanying drawings.

DESCRIPTION OF THE PREFERRED EMBODIMENT

Figure 1:
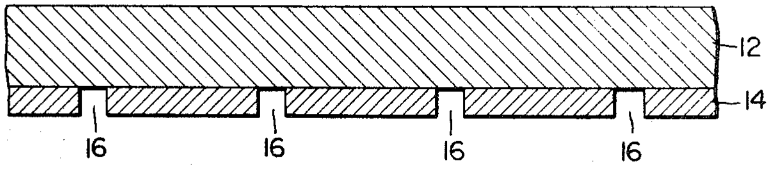
FIGS. 1 and 2 are cross sectional views of a silicon base structure during suitable stages of manufacture by a method incorporating the present invention.
Figure 2:
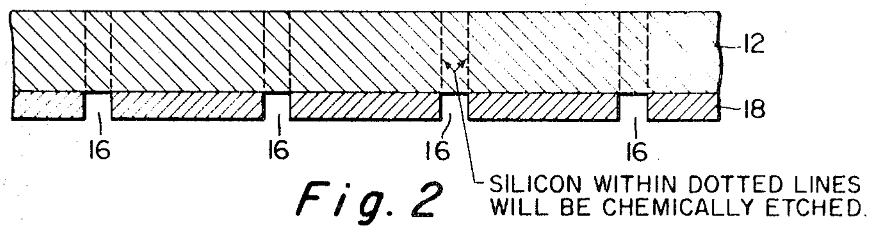

Referring to FIGS. 1 and 2 which show generally the present process and which are drawn on an enlarged scale for explanatory purposes, a silicon based material 12 is coated with a layer of tantalum 14 preferably by sputtering since the thickness thereof may be more accurately controlled by such process. A photoresist material which is a light-sensitive film is then applied to the tantalum layer. This light-sensitive film is exposed to light through a suitable negative having a desired pattern. The unexposed portion of the photoresist material is removed. Thereafter the unprotected tantalum is chemically removed preferably by a strong acid solution to form the openings 16. The exposed photoresist is stripped from the protected portion of tantalum after which the said remaining tantalum is anodized to form the oxide 18 which provides an inert mask during subsequent etching of the base silicon 12.

Figure 3:
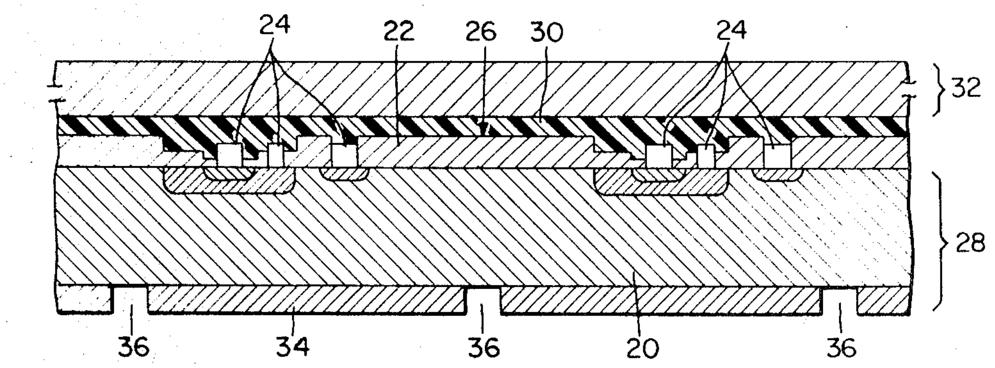
FIGS. 3 and 4 are cross sectional views of a silicon base air isolated microcircuit during the stages of manufacture which suitably illustrate the present invention.
Figure 4:
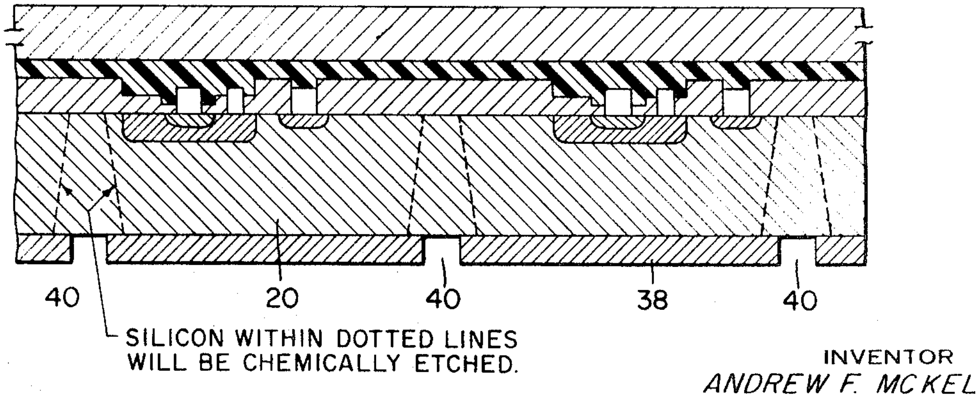

FIGS. 3 and 4 are specific examples of microcircuits drawn to an enlarged scale and fabricated by etching techniques in which the present improved masking step is incorporated. In fabricating air isolated microcircuits, the isolation of circuit components is accomplished after all circuit processing steps including metal delineation have been completed. By utilizing well known techniques the silicon base area 20 is formed. Next a layer of silicon dioxide 22 is positioned over the active base silicon. A metal layer is then positioned over the silicon dioxide layer 22 usually by an evaporation technique followed by delineating the interconnecting metal pattern 24 with methods well known in the art. The active side 26 of the thus formed circuit wafer 28 is attached by a suitable bonding substance 30 to a support wafer 32. Circuit wafer 28 is then thinned to a final desired thickness.

The improvement of this invention involves placing a tantalum coating 34 on the outer or thinned side of the wafer 28. Sputtering is the preferred technique of layering the tantalum since the thickness thereof may be more accurately controlled. The tantalum coating is masked by a light sensitive photoresist material which is exposed to light through a negative possessing the required pattern. The unexposed portion of the photoresist is removed and the thus unprotected portion of tantalum is removed by chemical action, preferably by a strong acid solution which forms a series of desired openings 36 and allows access to the underlying silicon 20 for subsequent etching techniques. The exposed photoresist is stripped and the remaining tantalum is anodized to tantalum oxide 38 (FIG. 4).

The thus formed tantalum oxide mask is created at room temperature and is inert to all known materials used to etch the underlying basic silicon substructure. It therefore is an effective masking device during the formation of isolation grooves 40 in said silicon substructure during microcircuit fabrication.

A tantalum oxide thickness of about 2000 Angstroms is adequate for masking purposes. However this thickness may be varied by adjusting the initial thickness of the sputtered tantalum.

I claim:

1. A method of silicon groove etching comprising:
- applying a tantalum layer to a silicon base substance;
- masking said tantalum layer with a light-sensitive film;
- exposing said light-sensitive film to light in a desired pattern;
- removing the unexposed portion of said light-sensitive film;
- removing chemically the unprotected tantalum;
- stripping the exposed light-sensitive film from the protected portion of tantalum;
- anodizing said remaining tantalum to form tantalum oxide thus creating an inert mask having a desired etching pattern; and
- etching said silicon base substance.

2. The method of claim 1 wherein the tantalum layer is applied to the silicon base material by a sputtering technique thus providing accurate control of the thickness of said tantalum.

3. The method of claim 1 wherein said tantalum oxide mask is formed at room temperature.

4. In a method of fabricating air isolated microcircuits in which a silicon circuit wafer is formed having a silicon base area with a silicon dioxide layer positioned on one side thereof and with a metal pattern delineated over said silicon dioxide, said circuit wafer being attached to a support wafer after which the circuit wafer is thinned to a desired level, the improvement comprising:
- positioning a tantalum layer on the thinned side of the said wafer;
- masking said tantalum layer with a light-sensitive film;
- exposing said light-sensitive film to light in a desired pattern;
- removing the unexposed portion of said light-sensitive film;
- removing chemically the tantalum left unprotected by removal of the unexposed portion of the light-sensitive film;
- stripping the exposed portion of light-sensitive film from the protected portion of tantalum;
- anodizing said remaining tantalum to form a tantalum oxide mask for the underlying silicon base material, said mask having a desired etching pattern; and
- etching said silicon base material to form desired isolation grooves.

5. In the improved method of fabricating an isolated microcircuit as defined in claim 4 wherein the tantalum layer is applied by a sputtering technique.

6. The method of claim 4 wherein said tantalum oxide mask is formed at room temperature.

References Cited

UNITED STATES PATENTS

| | | | |
|---|---|---|---|
| 3,154,450 | 10/1964 | Hoeckelman et al. ---- | 156—17 |
| 3,294,653 | 12/1966 | Keller, et al. -------- | 204—15 |
| 3,489,656 | 1/1970 | Balde -------------- | 204—15 |
| 3,493,820 | 2/1970 | Rosvold ------------ | 156—17 |

HOWARD S. WILLIAMS, Primary Examiner

T. TUFARIELLO, Assistant Examiner

U.S. Cl. X.R.

156—13, 17